United States Patent [19]

Groth

[11] 4,216,259

[45] Aug. 5, 1980

[54] HEAT REFLECTING PANE AND A METHOD OF PRODUCING IT

[75] Inventor: Rolf Groth, Bochum-Wattenscheid, Fed. Rep. of Germany

[73] Assignee: BFG Glassgroup, Paris, France

[21] Appl. No.: 104

[22] Filed: Jan. 2, 1979

Related U.S. Application Data

[63] Continuation-in-part of Ser. No. 839,938, Oct. 6, 1977.

[51] Int. Cl.² .................... C03C 17/22; B05D 5/06; B05D 3/02; B05D 3/04
[52] U.S. Cl. ............................... 428/216; 427/160; 427/166; 428/432
[58] Field of Search ............... 427/160, 166; 428/216, 428/432

[56] References Cited

U.S. PATENT DOCUMENTS

| 2,784,115 | 3/1957 | Brinsmaid et al. | 427/166 |
| 2,920,002 | 1/1960 | Auwarter | 427/166 X |
| 3,437,515 | 4/1969 | Quinn et al. | 427/166 X |
| 3,927,228 | 12/1975 | Pulker | 427/166 X |

Primary Examiner—James R. Hoffman
Attorney, Agent, or Firm—Hill, Van Santen, Steadman, Chiara & Simpson

[57] ABSTRACT

A heat-reflecting pane consists of a substantially transparent glass substrate with two layers of titanium oxide, the outside layer being in the rutile form with the intermediate layer being in the anatase form. The pane is formed by double coating the glass substrate with layers of titanium applied by vacuum deposition. A weaker vacuum is used to obtain the anatase form with a stronger vacuum used to obtain the rutile form. Both layers are then oxidized at temperatures of at least 550° C. to form $TiO_2$. The intermediate layer of $TiO_2$ in the anatase form prevents the rutile layer from becoming opaque when the pane is heated to the temperature necessary for heat treatment of the glass substrate. The treatment may be effected either during the heating step in which the titanium is oxidized or in a subsequent additional heating step.

13 Claims, 1 Drawing Figure

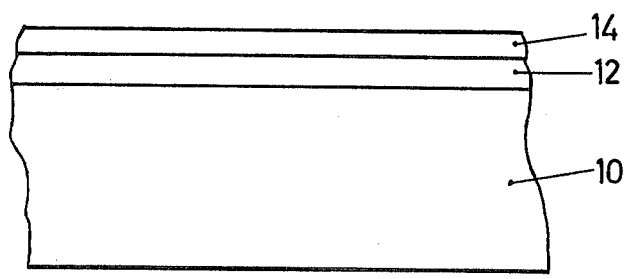

HEAT REFLECTING PANE AND A METHOD OF PRODUCING IT

RELATED APPLICATION

This application is a continuation-in-part of my earlier application Ser. No. 839,938 which was filed on Oct. 6, 1977.

BACKGROUND OF THE INVENTION

1. Field of the Invention

This invention relates to a heat-reflecting pane or panel comprising a substantially transparent glass substrate, for example of soda-lime-silicate glass, and further comprising two layers of $TiO_2$. The outside $TiO_2$ layer comprises $TiO_2$ in the rutile form with the intermediate layer $TiO_2$ in the anatase form. Both $TiO_2$ layers are formed in a similar manner by vapor deposition in vacuo and subsequent oxidation of the layer thus formed.

2. Description of the Prior Art

Heat-reflecting window glass panes of this kind in which a heat-reflecting $TiO_2$ layer is applied by vapor-coating of a titanium layer in vacuo and subsequent oxidation of such layer at very high temperatures in air are known and have been described e.g., in a publication by G. Hass entitled "Preparation, Properties and Optical Applications of Thin Films of Titanium Dioxide" (G. Hass, Vacuum, Vol. 2, No. 4, pp. 331-345 (1952)). Depending upon the conditions in which the Ti layer is vapor-coated in vacuo, there are two $TiO_2$ forms which may be produced in the subsequent oxidation of the Ti layer. When the titanium is vapor-coated rapidly in a good vacuum i.e., of approximately $10^{-5}$ mm Hg or even harder, the rutile form is produced, whereas if the vapor-coating proceeds relatively slowly in a less hard vacuum, e.g., of approximately $10^{-4}$ mm Hg, the anatase form is produced. $TiO_2$ layers produced in this way have a variety of uses and optics to coat glass panes, e.g., as color filters and as sunshine-reflecting coatings, the thickness of the layer being made such as to act as a highly effective quarter-wave interference layer, over the spectral range for which a modification of the reflection properties of the substrate is required.

One particular purpose for which heat-reflecting glass panes of the kind described are used is in facade elements or infilling panels for buildings. The requirements in the case of infilling panels of this kind are for $TiO_2$-coated glass panels which have a high neutral reflection, possibly with a slight blue or yellow tint, in the visible spectral range. The usual practice with panels of this kind is for the $TiO_2$ interference layer to be disposed on the outside of the building, the back of the glass substrate being treated with an opaque enamel or varnish, so that parts of the building behind the panel cannot be seen through it from the outside.

Films of $TiO_2$ in the rutile form are very advantageous, more particularly for the last mentioned purpose, since such layers have a higher index of refraction than anatase layers and can therefore provide higher reflection values which are very desirable in the case of facade elements and infilling panels. It has also been found that rutile films are much harder and much more resistant to abrasion than anatase films. Consequently, panes of glass where the $TiO_2$ interference film on the outside of the building has a rutile form can be exposed directly to the atmosphere without damage for a prolonged period of time. Also, the usual cleaning agents for outside surfaces of glass can be used to clean such panes or panels.

In some of the uses of $TiO_2$-coated glass panes or panels of the kind described, more particularly for use as a facade element or infilling panel, the glass must be toughened to comply with safety regulations. Toughening is necessary when infilling panels having rutile films are enameled on the back. Because of the presence of the enamel coating, which is impervious to radiation, the glass may become so hot in sunshine that heat cracks would occur in an untoughened glass substrate. The glass is prestressed or toughened in a known manner by being heated beyond its transformation temperature, the temperatures at which softening begins, and then cooled very abruptly. Temperatures of from about 570° to 620° C. are necessary for this purpose in the case of soda-lime-silicate glasses having the chemical composition of conventional flat glass.

The heating of the glass to toughen it in the manner described above may also be used to promote oxidation of the vacuum, vapor-coated Ti film. Alternatively, the vapor-coated Ti layer can first be oxidized at a temperature of from 400° to 500° C., in one furnace, the pane with its $TiO_2$ coating being thereafter cooled and being subsequently heated again, for toughening, in another furnace to the temperature necessary to toughen the glass, between 570° to 620° C. in the case of soda-lime-silicate glass.

Theoretically, of course, oxidation of the Ti film to $TiO_2$ should be carried out very rapidly to provide an acceptable layer of $TiO_2$ in the rutile form. It is known from G. Hass, Vacuum Vol. 2, No. 4, p. 335, FIG. 3, that oxidation proceeds faster in proportion as the oxidation temperature is higher. Unfortunately, when in the known process the oxidizing temperature is increased to above 550° C. in order to promote rapid oxidation, alterations occur in the rutile layers, which turn matt and dull and cause so much light scattering both in transmission and reflection that panes having such layers cannot be used for the purposes mentioned, that is as infilling panels and facade elements. A peculiarity is that these changes in the film occur only in rutile films. When other vacuum vapor-coating conditions are used, more particularly a softer vacuum and/or longer vapor-coating time, oxidation leading in the manner described to $TiO_2$ layers having the anatase form and panes which have been coated in this way can be heated to relatively high temperatures, such as 550° C. or more, without experiencing any of these changes in their coatings. Of course, the same difficulties of the rutile coatings undergoing changes always occur when the glass panes are toughened by heat treatment in the manner described, since for this purpose, and as already stated, the temperatures required are above 550° C. and in the case of soda-lime-silicate glasses are preferably of from 570° to 620° C. These unwanted changes in the coating occur when the panes are heated to the temperatures required for toughening irrespective of whether oxidation of the Ti layer to $TiO_2$ and heating to the glass toughening temperature are effected in a single step or whether the Ti layers are first oxidized at a relatively low temperature below 550° C. and only subsequently, possibly after further processing, are the panes heated to the temperatures necessary for toughening.

SUMMARY OF THE INVENTION

The parent application solves the problem of manufacturing heat-reflecting panes of the aforementioned kind, suitable for use as spandrel or infilling panels or facade elements, and of providing a method of manufacturing them wherein the $TiO_2$ films are mostly or entirely rutile and undesirable changes are effectively prevented from occurring in the films when heated to temperatures above 550° C., as required for rapid oxidation of the Ti film, more particularly for thermal toughening. To this end, according to the parent application, a vapor-deposited silicon oxide layer which does not cause interference is disposed between the glass pane and the $TiO_2$ film, the method according to the parent application being characterized in that a silicon oxide film which does not cause interference is vacuum-deposited on the glass pane before the Ti film is deposited, and the thus-coated glass pane is oxidized by heating in air.

According to the present invention, this problem is solved in a completely different manner from that used in the parent application. Correspondingly, a method according to the present invention for manufacturing a heat-reflecting pane of the kind according to this invention is also disclosed and claimed.

The invention is based upon the surprising discovery that the disadvantageous changes in a rutile $TiO_2$ film after heating to temperatures above 550° C., as required for thermal toughening, can be avoided if an intermediate film of $TiO_2$ in the anatase form is disposed between the glass pane and the rutile layer. The two films are produced as follows: A first Ti film is deposited on the glass pane relatively slowly and at a relatively low vacuum, after which a second Ti film is deposited relatively fast at a relatively high vacuum; as a result of subsequent oxidation, the anatase intermediate film is formed from the first Ti film on the glass pane and the rutile film is formed from the second Ti film.

It has been shown that like the invention disclosed in the parent application the invention of providing an anatase film between the glass pane and the rutile film completely solves the problem presented in the prior art, i.e., changes occurring in the film at the temperatures required for oxidation or thermal toughening. In addition, however, the $TiO_2$ coating does not crack or become loose even when it has a total thickness of up to 600 Å, as is required when it is desired to obtain a neutral-color external appearance. Since the same titanium-filled evaporator devices are preferably used for depositing both Ti films, the total coating, according to this invention, can be applied even more easily and economically than in the case of the heat-reflecting pane and the method according to the parent application. In addition, titanium coating material is available in wire form, whereas silicon monoxide, when used for layer coating, is in granular form, so that it is easier to weigh the amount of material required for the evaporator devices when this invention is used instead of that disclosed in the parent application. The double coating according to the invention has the same hardness and wear resistance as a rutile film without an anatase intermediate film, provided the rutile film is applied in a thickness of at least 80 Å. The total thickness of the rutile film portion of the total $TiO_2$ coating should not be more than approximately 300 Å, since otherwise the rutile film may crack. The maximum permissible thickness of the rutile film is slightly dependent on the temperature chosen for oxidizing the films or for thermal toughening, that is, the maximum permissible thickness is somewhat lower if the temperature is increased. In addition, the maximum permissible thickness of the rutile film before cracking is slightly influenced by the surface state of the glass before coating, i.e, if the glass surface is corroded or has not been carefully cleaned, the maximum permissible thickness is reduced.

Another special advantage of the coating according to the invention is that the glass pane is directly adjacent the $TiO_2$ coating, resulting in particularly firm adhesion. In addition, the Ti films, even before being oxidized, adhere very firmly to the glass, so that it is easier to handle the Ti-coated panes before the Ti films have been oxidized.

The prior art could not give a person skilled in this art any inkling of this invention. German Offenlegungsschrift No. 1,596,816 describes an arrangement in which $TiO_2$ and silicon dioxide layers are applied to a glass pane. The glass pane is covered first with a $TiO_2$ film and then with a silicon dioxide film. Similarly, CA Patent specification No. 464,446 discloses film systems wherein a mixed layer of $TiO_2$ and silicon oxide is deposited on a glass pane, followed by one or more pure $TiO_2$ or silicon dioxide films. However, these publications do not provide any information regarding the teaching of the invention: avoiding changes in $TiO_2$ films on glass panes by manufacturing the $TiO_2$ coating by vacuum deposition and subsequent oxidation and by providing an intermediate layer of anatase $TiO_2$ between the glass pane and the rutile $TiO_2$ film. Furthermore, U.S. Pat. No. 2,478,817, which relates in general to the manufacture of $TiO_2$ films using the immersion process, and Czechoslovak patent specification PV 4393-65, published in part in Glastechnische Berichte P 11, February 1968, do not come anywhere near the teaching of this invention, i.e., of manufacturing $TiO_2$ films by oxidizing vapor-coated Ti films in vacuo, by choosing the deposition conditions so that an intermediate anatase film is first deposited on the glass pane and subsequently covered with an outer film in the rutile modification, which has the advantageous properties relating to the outer surface of the pane as hereinbefore described.

Embodiments of the invention will be described in detail hereinafter with reference to the accompanying diagrammatic drawing.

BRIEF DESCRIPTION OF THE DRAWING

The single FIGURE forming the drawing is a view in section, showing the construction of a heat-reflecting pane embodying the invention.

DESCRIPTION OF THE PREFERRED EMBODIMENT

As the drawing shows, a heat-reflecting pane embodying the invention comprises a substantially transparent glass substrate or glass pane 10, more particularly of soda-lime-silicate glass, covered in succession by an anatase $TiO_2$ intermediate layer 12 and an outside rutile $TiO_2$ layer 14 disposed on the side of the anatase layer 12 remote from the glass substrate 10. The system of films may be produced by depositing a first titanium layer relatively slowly at a vacuum of the order of $10^{-4}$ Torr and then depositing a second Ti layer relatively fast in a vacuum of the order of $10^{-5}$ Torr, after which the two layers are oxidized at a temperature sufficient to produce the anatase and rutile modification respectively. The glass substrate shown in the drawings and in the example described herein, consists of thermally toughened glass, wherein the glass pane is heated to a temperature in the range of from 570° to 620° C., (in the case of soda-silicate glass), and then thermally toughened by rapidly cooling the pane. Preferably, the glass pane, coated with the two Ti films, is first heated to a temperature in the range of from 570° to 620° C., (in the case of soda-silicate glass), thus converting the deposited Ti films into the anatase layer 12 and the rutile layer 14 and also heating the glass pane 10 to the temperature required for thermal toughening, so that it can immediately be chilled. No disadvantageous changes have been observed in rutile $TiO_2$ films 14 prepared in this way. Even long-term tests do not show any changes in the $TiO_2$ coating.

Two examples will now be given. Example 1 illustrates the result produced when the provision of an intermediate layer of rutile $TiO_2$ is omitted. Example 2, illustrating by way of comparison, the result when an intermediate layer of rutile $TiO_2$ is provided in accordance with the invention.

EXAMPLE 1

A float glass pane 8 mm thick and having external dimensions of 300 cm × 245 cm was first cleaned in the conventional manner by a glow discharge at a pressure of $3 \times 10^{-2}$ Torr in a vacuum deposition plant. Next, a Ti film was vacuum-deposited at a pressure of $5 \times 10^{-5}$ Torr for 35 seconds. Next, the coated pane was heated to 620° C. in a conventional thermal toughening furnace and then chilled. During the heating process, the titanium film was oxidized to a titanium film 470 Å thick having a rutile structure. However, the film was turbid and matt and was thus unsuitable, for architectural reasons, for use as an infilling panel or facade element for a building or the like.

EXAMPLE 2

The procedure was the same as for Example 1 except with the difference that after the glow discharge purification, a first Ti film was deposited at a pressure of $1.5 \times 10^{-4}$ Torr for two minutes, after which the deposition process was interrupted, the vacuum was made more intense, and a second Ti film was deposited at a pressure of $5 \times 10^{-5}$ Torr for 20 seconds. The $TiO_2$-coated pane was then toughened in the same manner as in Example 1. The outer $TiO_2$ layer, which was produced from the Ti layer applied at high vacuum, had a rutile structure, whereas the intermediate layer had an anatase structure. In contrast to the pane produced according to Example 1, the pane produced in Example 2, according to the invention, was completely transparent after toughening, and could be used very satisfactorily as an infilling or spandrel panel or as a facade element for a building or the like. The pane had a neutral-color with a silvery, shining appearance. Its reflective power, relative to the sensitivity of the human eye to brightness, was 40%. Utilization of this pane is therefore architecturally useful in conjuntion with insulating glass panes of a neutral color.

While I have disclosed an exemplary method and structure to illustrate the principles of my invention, it should be understood that I wish to embody within the scope of the patent warranted hereon all such modifications as reasonably and properly come within the scope of my contribution to the art.

I claim as my invention:

1. A heat-reflecting pane comprising:
a substantially transparent glass substrate; and
two adjacent layers of $TiO_2$ on said glass substrate comprising:
an intermediate layer of $TiO_2$ on said glass substrate;
said intermediate layer of $TiO_2$ being in the anatase form; and
an outside layer of $TiO_2$ on said glass substrate;
said outside layer of $TiO_2$ being in the rutile form;
said adjacent layers having been formed by first depositing an intermediate Ti layer to said glass substrate by vapor deposition in vacuo followed by depositing an outside Ti layer to said intermediate layer of Ti by vapor deposition in vacuo and subsequently oxidizing said intermediate and outside Ti layers at a temperature of at least 400° C.

2. A heat-reflecting pane as defined in claim 1 wherein said adjacent layers of $TiO_2$ have a combined thickness of between 300 and 600 Å.

3. A heat-reflecting pane as defined in claim 2 wherein said intermediate layer of $TiO_2$ has a thickness of at least 30 Å.

4. A heat-reflecting pane as defined in claim 3 wherein said outside layer of $TiO_2$ has a thickness of no greater than 300 Å.

5. A heat-reflecting pane as defined in claim 4 wherein said outside layer of $TiO_2$ has a thickness of at least 80 Å.

6. A heat-reflecting pane as defined in claim 5 wherein said outside layer of $TiO_2$ has a thickness of between 220 and 250 Å.

7. A heat-reflecting pane as defined in claim 1 wherein said glass substrate has been toughened by being heated to a temperature of at least 550° C., preferably 570° to 620° C., followed by chilling.

8. A method of manufacturing a heat-reflecting pane comprising:
providing a substantially transparent glass substrate;
applying an intermediate Ti layer to the side of said glass substrate by vapor deposition in vacuo, using a pressure of approximately $10^{-4}$ Torr in order to obtain the anatase form of $TiO_2$;
applying an outside Ti layer to the previously formed Ti layer by vapor deposition in vacuo, using a pressure of at least $10^{-5}$ Torr in order to obtain the rutile form of $TiO_2$;
subsequently heating the pane in air to a temperature of at least 550° C. in order to oxidize both Ti layers to form two layers of $TiO_2$, the outside Ti layer being in the rutile form with the intermediate layer being in the anatese form; and
subsequently cooling the pane.

9. A manufacturing method as defined in claim 8 wherein said intermediate Ti layer is deposited in more than 60 seconds at a pressure of between $1 \times 10^{-4}$ and $2 \times 10^{-4}$ Torr and said outside Ti layer is deposited in less than 30 seconds at a pressure of between $1 \times 10^{-5}$ and $6 \times 10^{-5}$ Torr.

10. A manufacturing method as defined in claim 8 wherein the application steps occur in a vapor-coating device and comprise:
applying said intermediate Ti layer;
lowering the pressure; and
applying said outside Ti layer, whereby the two Ti layers are vapor-deposited in succession using the same vapor-coating device.

11. A manufacturing method as defined in claim 8 wherein the heating step consists of heating the pane to a temperature of between 570° and 620° C. in order to oxidize the Ti films.

12. A manufacturing method as defined in claim 11 wherein the cooling step is effected rapidly to chill the glass substrate and toughen the same.

13. A manufacturing method as defined in claim 8 wherein after cooling of the pane subsequent to said step of heating the pane to at least 550° C. to oxidize the Ti layers, the pane is again heated to at least 550° C., preferably 570° to 620° C., and is then rapidly cooled to chill the glass substrate and toughen the same.

* * * * *